(12) United States Patent
Keller et al.

(10) Patent No.: US 7,464,349 B1
(45) Date of Patent: Dec. 9, 2008

(54) METHOD AND SYSTEM OR GENERATING A CURRENT SOURCE MODEL OF A GATE

(75) Inventors: Igor Keller, Pleasanton, CA (US); Manuj Verma, Noida (IN)

(73) Assignee: Cadence Design Systems, Inc., San Jose, CA (US)

( * ) Notice: Subject to any disclaimer, the term of this patent is extended or adjusted under 35 U.S.C. 154(b) by 322 days.

(21) Appl. No.: 11/246,060

(22) Filed: Oct. 11, 2005

(51) Int. Cl.
*G06F 17/50* (2006.01)
(52) U.S. Cl. .................................. 716/4; 716/5; 716/6
(58) Field of Classification Search .............. 716/4–6; 703/14, 18–19
See application file for complete search history.

(56) References Cited

U.S. PATENT DOCUMENTS

| | | | |
|---|---|---|---|
| 6,278,964 B1 * | 8/2001 | Fang et al. ................... 703/19 |
| 6,604,066 B1 * | 8/2003 | Hatsuda ....................... 703/19 |
| 2002/0021135 A1 * | 2/2002 | Li et al. ...................... 324/677 |
| 2004/0249588 A1 * | 12/2004 | Shimazaki et al. ............ 716/6 |
| 2005/0278671 A1 * | 12/2005 | Verghese et al. .............. 716/6 |
| 2006/0095869 A1 * | 5/2006 | Levy ............................ 716/1 |

* cited by examiner

*Primary Examiner*—Paul Dinh
(74) *Attorney, Agent, or Firm*—Rosenberg, Klein & Lee

(57) ABSTRACT

Aspects for generating a current source model of a gate include extracting the current source model of the gate. The current source model of the gate is a function of time and output voltage of the gate. Further, the current source model of the gate is extracted based on data present in a timing library. The aspects further include storing the current source model of the gate. This is carried out by using the existing, specified timing library for current source models. In this manner, additional expenditure is not incurred for formulating another timing library.

14 Claims, 10 Drawing Sheets

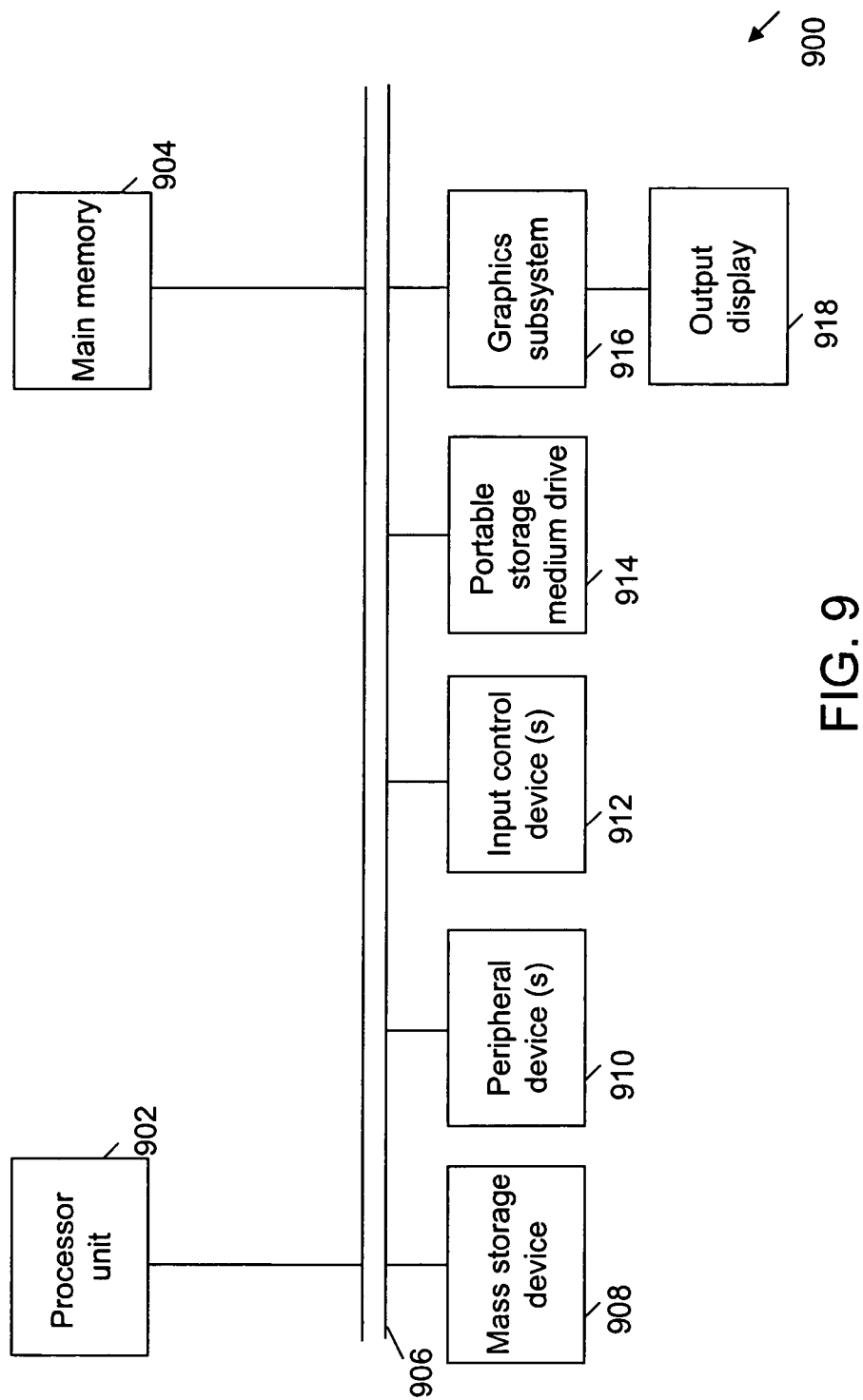

METHOD AND SYSTEM OR GENERATING A CURRENT SOURCE MODEL OF A GATE

BACKGROUND

The present invention relates to generating a current source model of a gate.

Advancement in semiconductor technology has resulted in need for nanometer cell characterization and model generation. Nanometer cell characterization requires complex and efficient models with better timing and noise accuracy. One of the conventional techniques for assessing the speed at which a digital chip runs and determining the signal delay includes static timing analysis.

Determination of the signal delay through a cell is critical for accurate static timing analysis of the digital chip. This is because the output voltage curve is dominated by transistors' non-linear characteristics. Inaccurate determination of the signal delay results in timing closure loops and incorrect analysis.

Several methods have been conventionally used for determining the signal delay of the output signal curve of the digital chip. One such method is based on an instance-based delay calculation. The signal delay calculation is performed by using a timing library. The 2-d data in the timing library is generated, based on a load capacitance and an input signal slew rate, to derive a change in the output voltage with respect to a change in the input voltage. However, this method does not account for the effect of non-linear input transition waveform and complex load.

This problem of circuit level and device-level non-linear characteristics is addressed by another conventionally used method for determining the signal delay. The method determines the signal delay by modeling a cell's output drive as a current source rather than a voltage source. However, this method is capable of only describing the response on the gate for a load that has small resistive shielding and is decoupled.

In light of the foregoing discussion, a need exists for a manner for generating a current source model of a gate, which is capable of computing the output response for arbitrary coupled loads. The present invention addresses such a need.

SUMMARY

Aspects for generating a current source model of a gate include extracting the current source model of the gate. The current source model of the gate is a function of time and output voltage of the gate. Further, the current source model of the gate is extracted based on data present in a timing library. The aspects further include storing the current source model of the gate.

Through the present invention, accurate calculation of the response of the gate can be achieved with an arbitrary load. This is carried out by using the 2-d data present in a timing library for slew and delay at the output of a cell (as functions of slew at the input and the lumped load at the output of the cell) to approximate the current source model of the cell. In this manner, additional expenditure is not incurred for more characterization other than the timing library. These and other advantages will be more fully appreciated in conjunction with the following detailed description and accompanying drawings.

BRIEF DESCRIPTION OF THE DRAWINGS

Various embodiments of the present invention will hereinafter be described in conjunction with the appended drawings, provided to illustrate and not to limit the present invention, wherein like designations denote like elements, and in which:

FIG. 9 illustrates a block diagram of a general-purpose computer system for executing electronic design automation (EDA) software, in accordance with various embodiments of the present invention.

DESCRIPTION OF VARIOUS EMBODIMENTS

Various embodiments of the present invention relate to generating a current source model of a gate using timing information from a timing library. The current source model of the gate is generated by extracting a current source model of the gate. The extraction of the current source model further includes computing the signal delay of the gate. In various embodiments of the present invention, the current source model of the gate is a function of time and output voltage. The output voltage response, from which the delay is computed, is obtained through solving a nonlinear set of equations involving arbitrary load and the extracted current model for a driver. Consequently, the signal delay associated with the gate is calculated based on the extracted current source model of the gate and actual load. Further, various embodiments of the present invention enable computation of the signal delay in the presence of an arbitrary load and switching aggressors.

Figure 1:
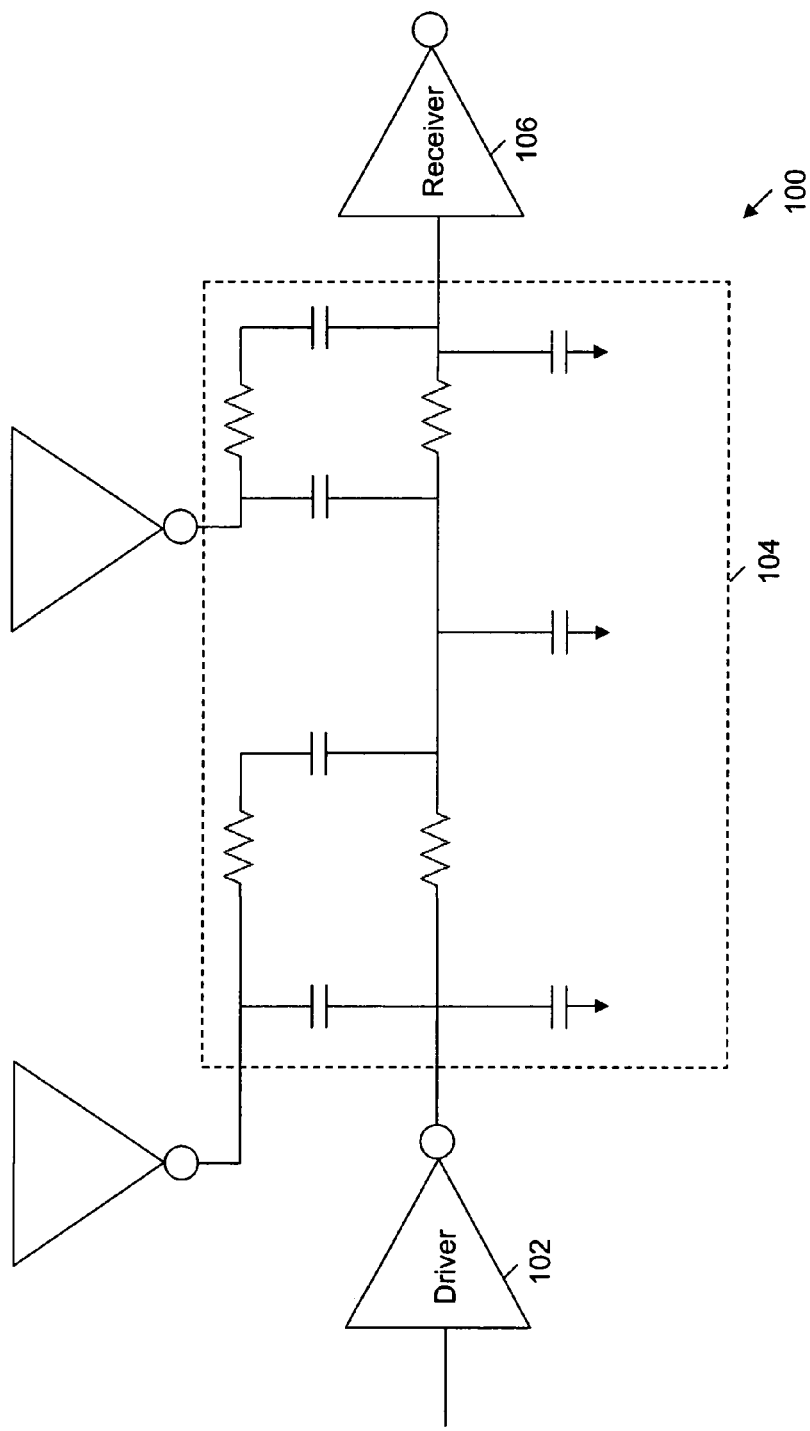
FIG. 1 illustrates an example circuit, wherein the various embodiments of the present invention can be practiced.

FIG. 1 illustrates an example circuit 100, wherein the various embodiments of the invention can be practiced. In various embodiments of the invention, circuit 100 can be a part of an Integrated Circuit (IC). Circuit 100 includes a driver 102, an interconnect 104, and a receiver 106.

Driver 102 represents a broad category of circuit elements that provide driving sources at an output stage of a circuit, which can be a combination of various gates. By way of example, the driving sources can be charging and discharging paths. Interconnect 104 connects driver 102 with receiver 106.

Interconnect 104 can be a wire, coupled to neighboring wires, that connects driver 102 with receiver 106. As shown in FIG. 1, interconnect 104 can have resistances and capacitances associated with them. The capacitances can include coupling capacitances between the neighboring wires. These coupling capacitances can result in crosstalk. Further, the capacitances, resistances, or their combination thereof, can induce a signal to either slow down or to speed up the transmission of the signal via interconnect 104.

Receiver 106 represents a broad category of circuit elements that receives signals, originating from driver 102 and transmitted over interconnect 104, and subsequently propagates them through circuit elements connected to it. Example circuit elements can be gates and their combinations. One of the parameters for measuring the performance of circuit 100 is the signal delay induced by driver 102, interconnect 104 and receiver 106.

An input voltage signal is characterized by an input signal slew rate. The input signal slew rate by way of example, measures the rate at which a voltage rises from 10 percent of $V_{dd}$ to 90 percent of $V_{dd}$, or falls from 90 percent of $V_{dd}$ to 10 percent of $V_{dd}$, wherein, $V_{dd}$ is the maximum voltage level. These thresholds can be different and are parameters stored in the timing library.

Figure 2:
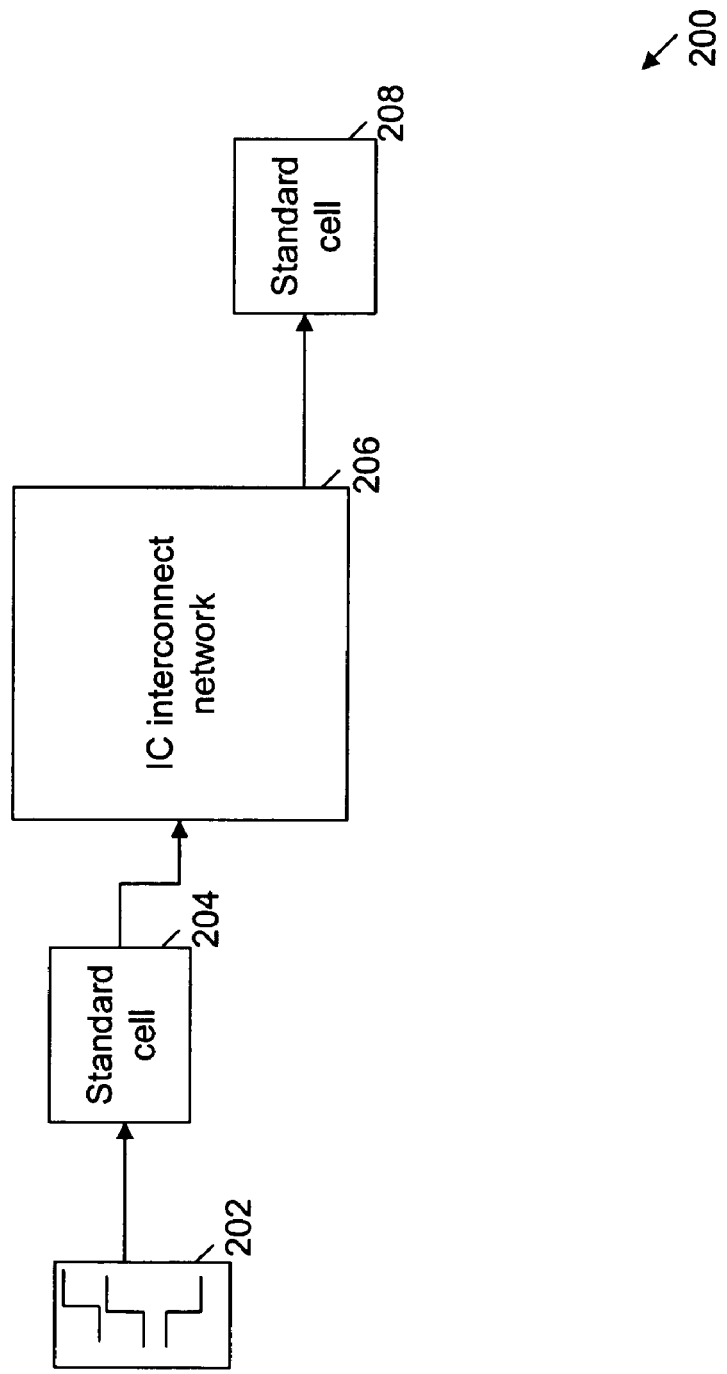
FIG. 2 illustrates another example circuit, wherein a current source model of a gate can be generated, in accordance with an embodiment of the present invention.

FIG. 2 illustrates another example circuit, wherein a current source model of a gate can be generated, in accordance with an embodiment of the present invention. Circuit 200 includes input vectors 202, a standard cell 204, an IC interconnect network 206, and a standard cell 208. Standard cell 204 is coupled to standard cell 208 through IC interconnect network 206. IC interconnect network 206 includes wires deposited on one or more metal or polysilicon layers of the integrated circuit.

Standard cell 204 and standard cell 208 implement one or more gate-level circuits. By way of example, gate-level circuits can be circuits that employ buffers, memory, gates, flip flops, and clock circuits. Input vectors 202 are an input for standard cell 204, so as to drive one or more gate-level circuits implemented in standard cell 208.

Figure 3:
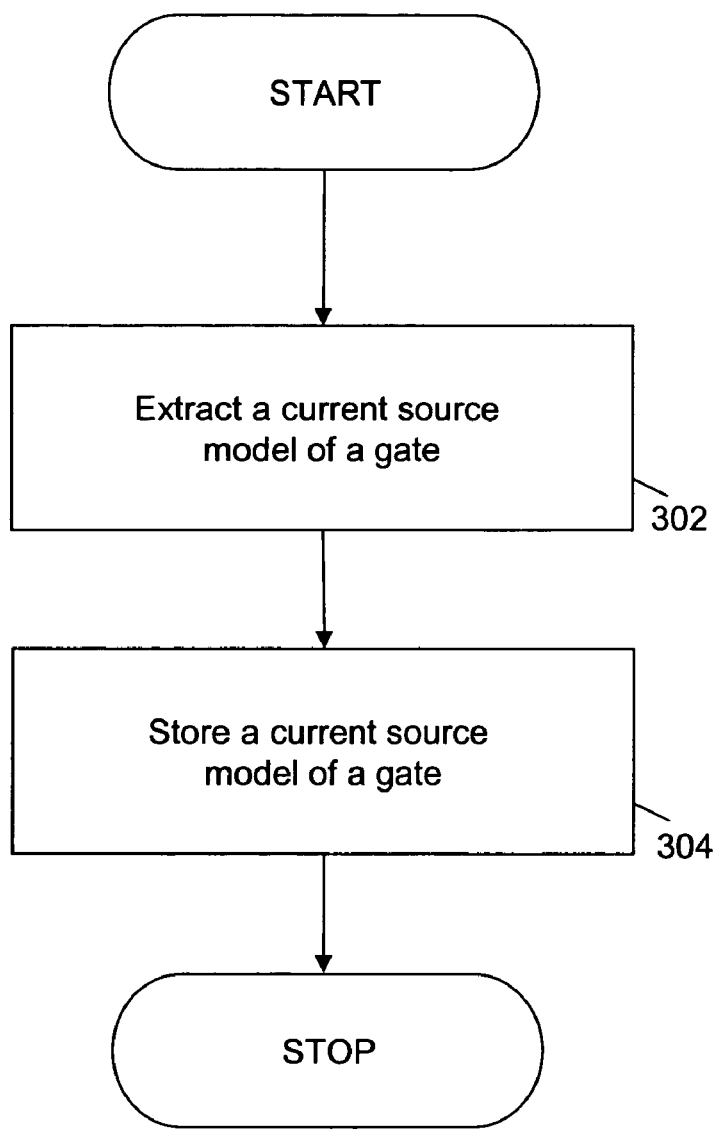
FIG. 3 illustrates a flow chart for generating a current source model of a gate, in accordance with an embodiment of the present invention.

FIG. 3 illustrates a flow chart for generating a current source model of a gate, in accordance with an embodiment of the present invention. The gate is standard cell 204. IC interconnect network 206 acts as a load applied on the gate. This load can be either variable or constant. The variable load can have any arbitrary value. The load can be resistive, capacitive, or a combination thereof. At act 302, a current source model of the gate is extracted. The extraction of the current source model of the gate is further explained in conjunction with FIGS. 4A and 4B. The current sourced from the gate is a function of the time and an output voltage of the gate. Subsequently, at act 304, the current source model of the gate is stored.

In various embodiments of the present invention, the timing library can be a pre-characterized .lib library.

In various embodiments of the present invention, the output slew rate can be determined through a fitting process, based on the timing library. In various embodiments of the invention, the timing library can be used for computing the output slew rate. In various embodiments of the present invention, the output voltage of the gate is determined from a d.c. transfer curve, i.e., the output voltage response of the gate in the absence of a load.

Figure 4A:
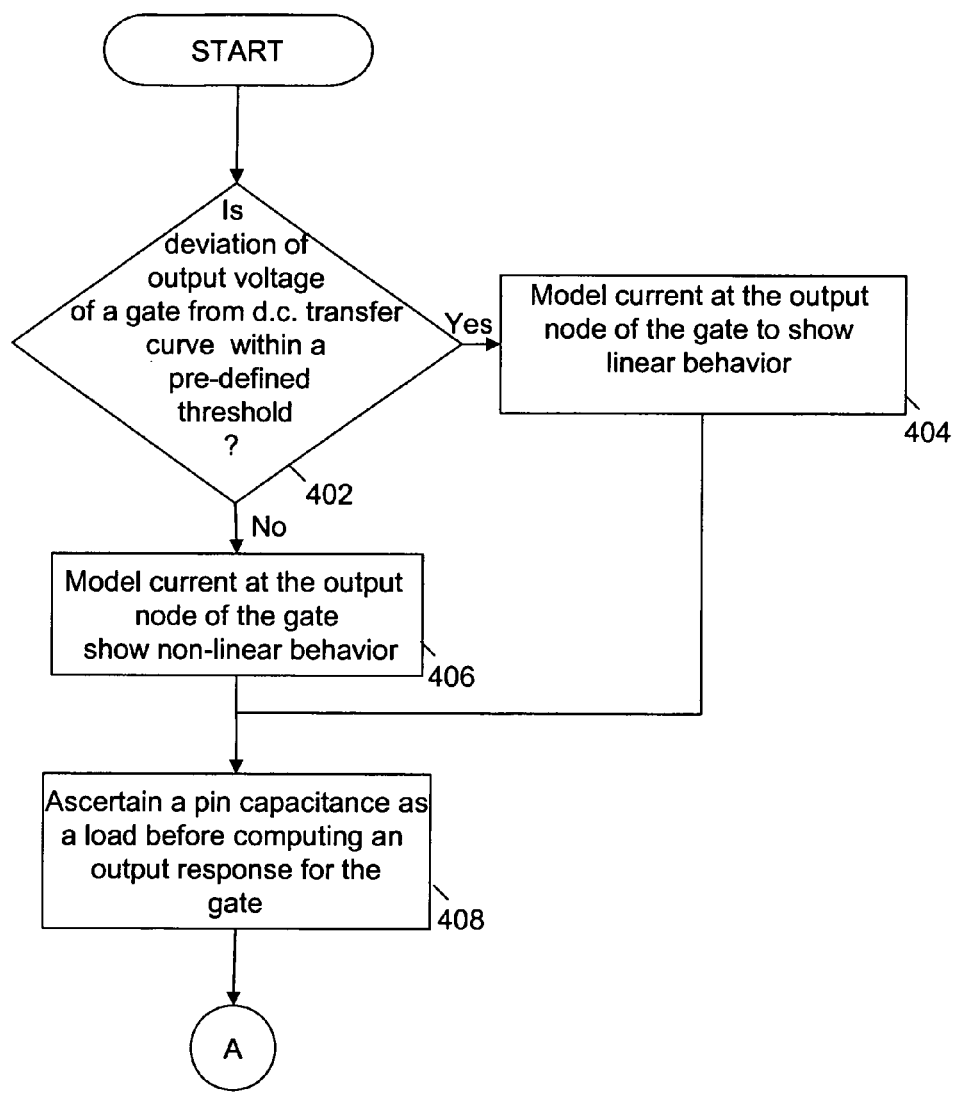
FIGS. 4A and 4B illustrate a flow chart for extracting a current source model of a gate, in accordance with an embodiment of the present invention.
Figure 4B:
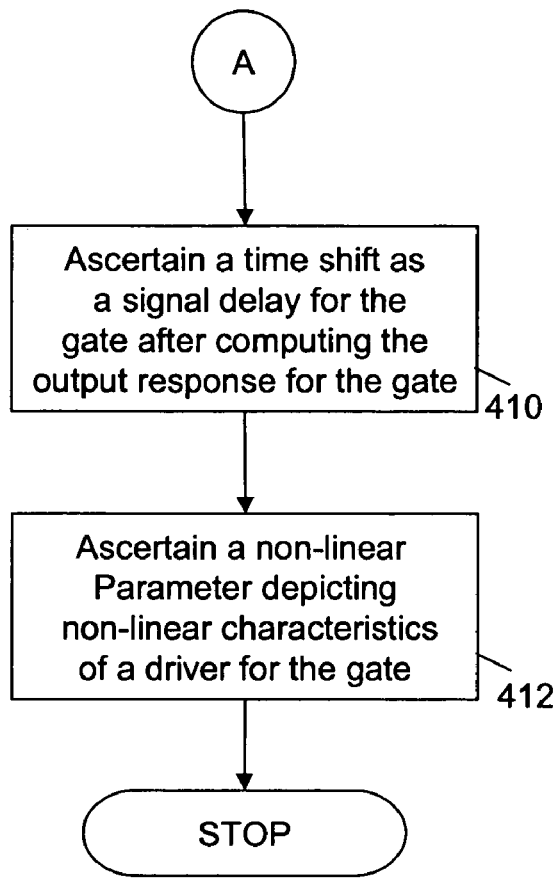

FIGS. 4A and 4B illustrate a flow chart for extracting a current source model of a gate, in accordance with an embodiment of the present invention. At act 402, it is determined whether the deviation of the output voltage of the gate, from the d.c. transfer curve is within a pre-defined threshold. If the deviation of the output voltage of the gate is within the pre-defined threshold, then act 404 is performed. At act 404, the current at the output node of the gate is modeled, to show a linear behavior, and control proceeds to act 408. The linear behavior of the current can be depicted by the following equation:

$$I(t, V_{out}) = g(t) * (V_{out} - V_{dc}); \quad (1)$$

wherein, $V_{dc}$ is the voltage in accordance with the d.c. transfer curve; g (t) is the admittance of the load associated with the gate; and $V_{out}$ is the output voltage.

However, if the deviation of the output voltage of the gate exceeds the pre-defined threshold, then act 406 is performed. At act 406, the current at the output node of the gate is modeled to show a non-linear behavior. In various embodiments of the invention, the current is modeled to be saturating.

The non-linear behavior of the current associated with the gate can be depicted by the following equation:

$$I(t, V_{out}) = g(t) * [e^{-\alpha(V_{out} - V_{dc})} - 1]/\alpha; \quad (2)$$

wherein, $\alpha$ describes the non-linearity of driver 102, and $\alpha$ can be found through the fitting process.

The above-described behavior of the current, in accordance with equations 1 and 2, can be depicted as following:

for ($V_{out} \gg V_{dc}$) the current saturates for ($V_{out} > V_{dc}$) the current is negative for ($V_{out} < V_{dc}$) the current is positive At act 408, a pin capacitance, Cpin is ascertained as a load of the gate. In various embodiments of the present invention, $C_{pin}$ is a function of output slews and delays corresponding to the input slews, and the load applied to the gate.

In accordance with an embodiment of the present invention, $C_{pin}$ can be ascertained by the following equation:

$$C_{pin} = (C_1 * \tau_2 - C_2 * \tau_1)/(\tau_1 - \tau_2); \quad (3)$$

wherein, $\tau_1, \tau_2$ are the two output slews, $D_1, D_2$ are delays corresponding to smallest input slew and the two biggest loads, $C_1, C_2$.

In various embodiments of the present invention, the values of $\tau_1, \tau_2, D_1, D_2$, and $C_1, C_2$ are available in the timing library. The timing library is a 2-d table comprising values of rise time, fall time, fall transition time, and rise transition time as a function of input-slew and the load of the gate.

In various embodiments of the invention, $C_{pin}$ is ascertained before computing an output response, i.e., the output voltage of the gate.

At act 410, the time shift as a signal delay for the gate is ascertained. In various embodiments of the present invention, the time shift is a function of the delay corresponding to the actual input slew and load applied to the gate. The load applied to the gate is closest to the total capacitance of the circuit driven by the gate.

In accordance with an embodiment of the present invention, the time shift can be computed by integrating the current over time till the voltage reaches V*V* is the reference voltage that defines delay at a particular time. In accordance with an embodiment of the present invention, V* can be 50 percent of the output voltage.

At act 412, a non-linear parameter describing non-linear behavior in the current source model is ascertained. In an embodiment of the present invention, the non-linear parameter depicts the non-linear characteristics of driver 102 for the gate. The non-linearity of driver 102 can be due to switching of input vector 202, which is defined as switching aggressors. In various embodiments of the invention, the non-linear parameter $\alpha$ accounts for the non-linearity of the gate. The non-linearity of the gate is due to the nature of a transistor.

In accordance with an embodiment of the present invention, $\alpha$ can be calculated by using the Newton Raphson method for the following equation:

$$[(D_1-D_2)/(\tau_1-\tau_2)]*\ln[(V_H/V_L)*((1-\alpha V_L)/(1-\alpha V_H))]=\ln [V^*/1-\alpha V^*] \quad (4);$$

wherein, $V_H$ is the high slew measurement threshold, $V_L$ is the low slew measurement threshold, and $V^*$ is the reference voltage that defines delay at a particular time. In various embodiments of the invention, $V_H$ and $V_L$ are stored in the lib library. In accordance with an embodiment of the present invention, $V^*$ can be 50 percent of the output voltage.

In accordance with an embodiment of the present invention, the non-linearity of driver 102 can be determined by using the fitting process. The transition can be constructed using three domains. The three domains have been illustrated in conjunction with FIG. 5.

Figure 6:
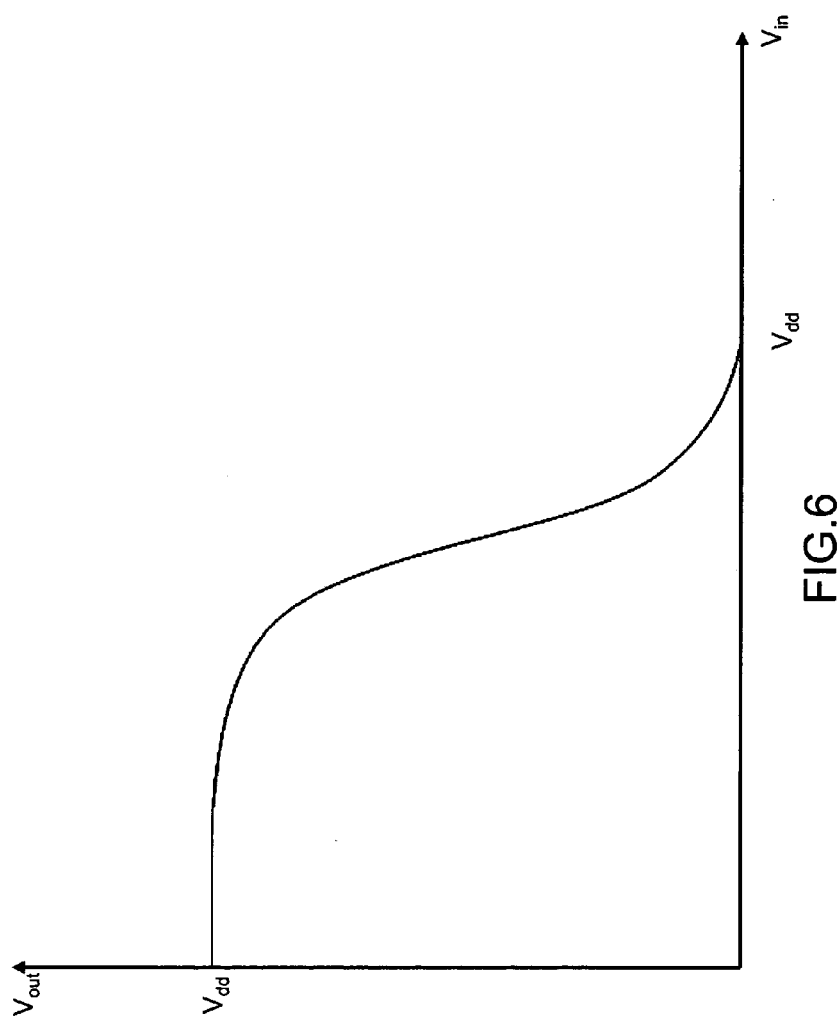
FIG. 6 illustrates a graph for d.c. transfer curve, in accordance with various embodiments of the present invention.
Figure 7:
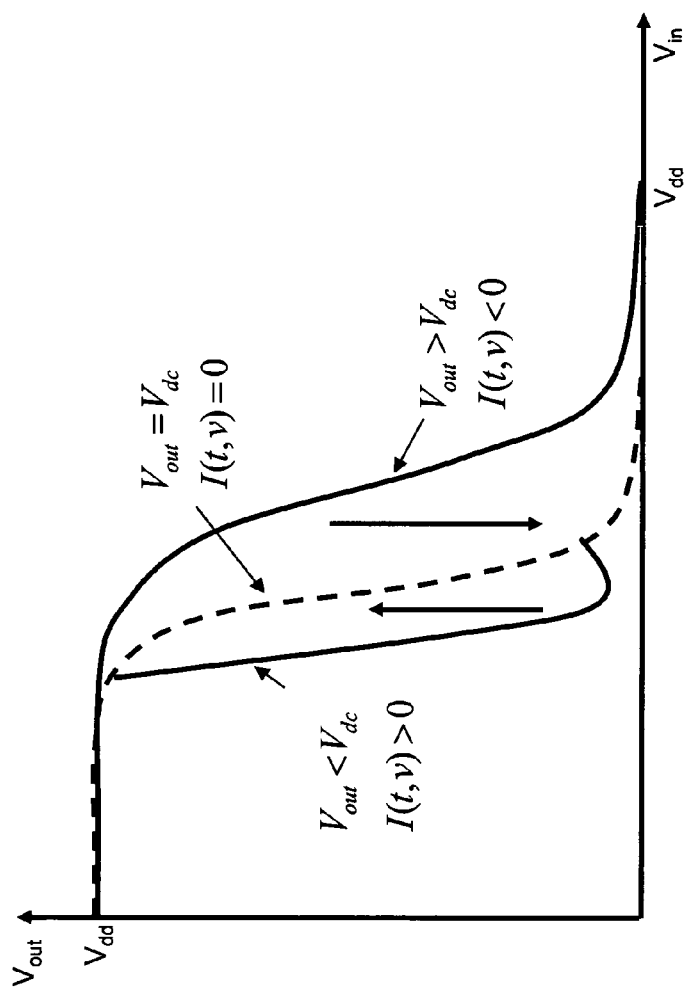
FIG. 7 illustrates a graph for a possible transition on the output of a gate in the presence of crosstalk, in accordance with various embodiments of the present invention.

Further, example graphs showing the behavior of the current at various loads have been illustrated in FIGS. 6 and 7.

In accordance with various embodiments of the present invention, a chip designer sets the pre-defined threshold.

Figure 5:
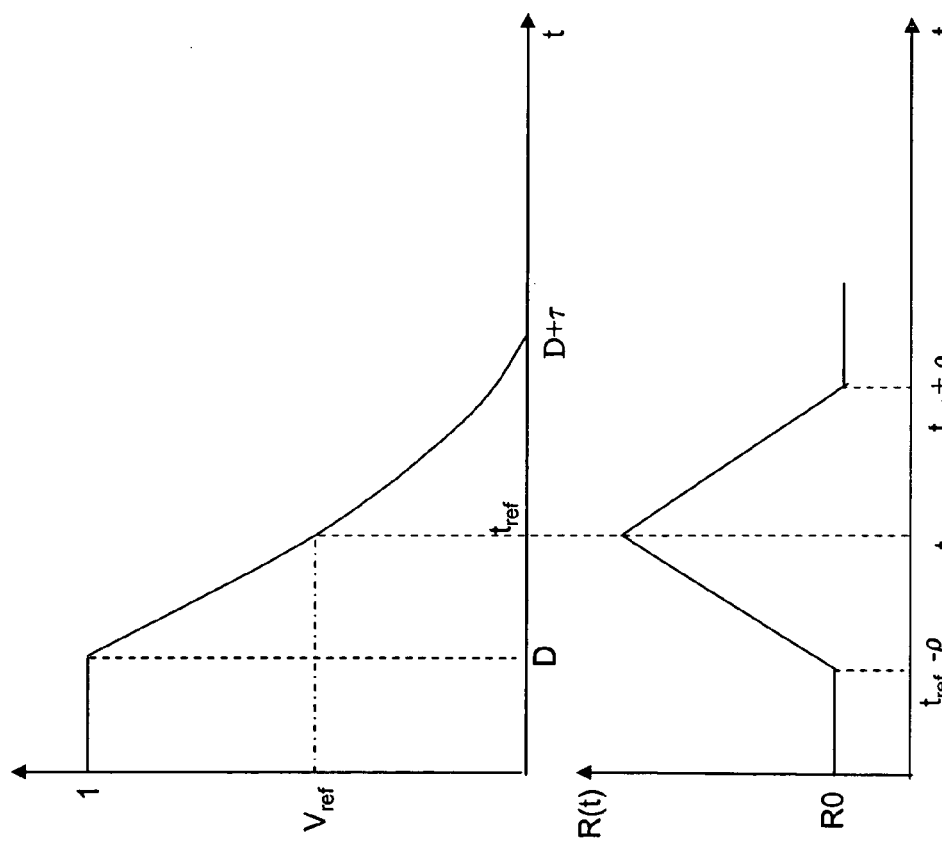
FIG. 5 illustrates a diagram for an approximation of the d.c. transition, in accordance with an embodiment of the present invention.

FIG. 5 illustrates a diagram for an approximation of the d.c. transition, in accordance with an embodiment of the present invention. The d.c. response is approximated by the following expression:

$$V_{dc}=1 \text{ for } t<D$$

$$V_{dc}=(e^{-\xi(t-D)-K})/(1-K) \text{ for } D<t\leq D+\tau,$$

$$V_{dc}=0 \text{ for } t>D+\tau$$

wherein, D is the delay, K is a fitting parameter, which signifies the shift of the DC transfer, and $\xi$ signifies the decay rate of the DC transfer characteristics in the switching region, characteristics. D, K, and $\xi$ are parameters of the current source model that are obtained through the fitting process using the timing library.

In various embodiments of the present invention, delay, D is defined using gate delay from the delay table in the timing library. To obtain the delay, D, the transition on the output is found using lumped load and D is chosen such that crossing point reference $V_{ref}$ of the found response is equal to D. The response is found numerically using KCL equation for the output node and lumped load.

$$C_{load}\frac{dV_{out}}{dt}=I(t,V_{out}) \quad (5)$$

Equation (4) is solved using first-order forward Euler method.

$C_{load}$ signifies the equivalent lumped capacitacitive load seen by an output pin, when connected to a load which may be either resistive, capacitive, or a combination thereof.

Time-dependent impedance R(t) of the load associated with the gate is obtained through the fitting process to model real behavior of the gate. The time dependent impedance, R(t) of the load can be obtained by the following equation:

$$R(t)=1/g(t);$$

wherein, the function for R(t) is Piece Wise Linear (PWL) and is defined as:

$$R(t)=R0 \text{ for } t<t_{ref}-\rho$$

$$R(t)=R0+R1(1-|t-t_{ref}|/\rho) \text{ for } |t-t_{ref}|<\rho$$

$$R(t)=R0, \text{ for } t>t_{ref}+\rho$$

wherein, R0 is steady state impedance. The steady state impedance is the same as the impedance when the signal is not switching, R0+R1 is the peak impedance when the signal switches, $t_{ref}$ is the time at which the signal reaches $V_{ref}$, and $\rho$ is half the total time taken by the signal to switch. In addition, $\rho$ signifies the time for which the signal is not steady, i.e. the signal is switching.

In various embodiments of the present invention, R0, $t_{ref}$, and $\rho$ are obtained through the fitting process.

FIG. 6 is a graph illustrating the d.c. transfer curve, in accordance with various embodiments of the present invention. The d.c. transfer curve shows the change in the voltage at the output node in response to a change in the input node of the gate. If the load on the output of the gate is zero, a transition is obtained using the d.c. transfer function of the gate, such that:

$$V_{dc}=F_{DC}(v_{in});$$

wherein, $V_{dc}$ is the output voltage when load is zero, $F_{DC}$ is the d.c. transfer function that can be obtained though a series of d.c. simulation in a SPICE simulator, and $v_{in}$ is the input voltage to the gate.

Further, the current injected by the gate into the load is a function of input transition and output voltage. Since input transition is known from analysis on the previous stage in the framework of static timing analysis, the current drawn by the gate can be represented as a function of time and instantaneous output voltage.

Furthermore, the magnitude of the current drawn by the gate is a function of deviation of the output voltage from the one obtained for zero load. As a result, $$I(t,V_{out})=F(t,V_{out}-V_{dc});$$

wherein, $V_{out}$ is the instantaneous output voltage. Consequently, the current becomes zero for $V_{out}=V_{dc}$.

Since the current is zero when the output voltage is same as that for d.c. output transition, there must be a change in sign when the output voltage crosses the d.c. transition.

FIG. 7 is a graph illustrating a possible transition on the output of a gate due to cross talk and also the d.c. transfer curve of the gate, in accordance with various embodiments of the present invention.

The dashed line denotes transition when the load is zero. Hence, the current is zero. For non-zero load the output transition occurs after the d.c. transition due to a need to discharge the charge stored in the load. The current injected by driver 202 into the load is negative, and is proportional to the distance of the output voltage from the output voltage when the load is zero.

If by some reason, by way of example due to crosstalk, voltage on the output node is below the d.c. transition, the current drawn by the gate is positive and tries to return the voltage when the load is zero.

Figure 8:
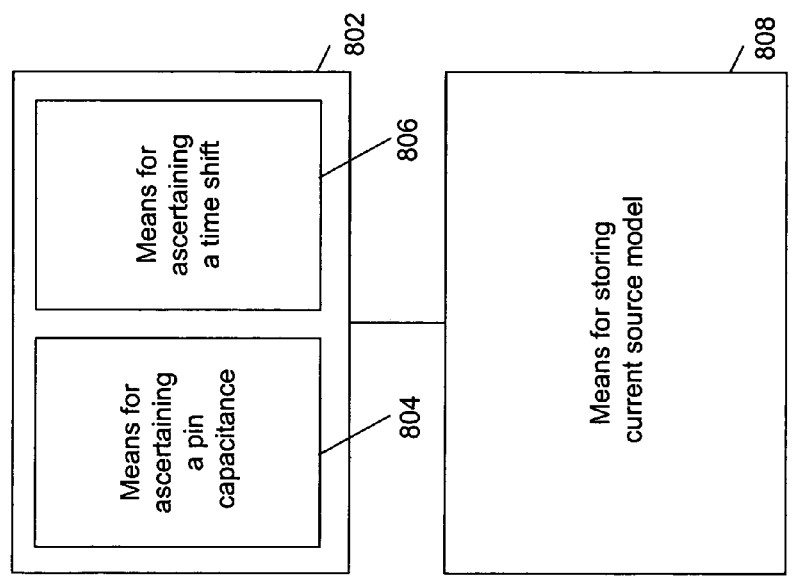
FIG. 8 illustrates a block diagram of various functional modules for generating a current source model of a gate, in accordance with an embodiment of the present invention.

FIG. 8 is a block diagram illustrating various functional modules for generating a current source model of a gate, in accordance with an embodiment of the present invention. The block diagram includes means for extracting current source model 802 and means for storing current source model 808. Means for extracting current source model 802 includes means for ascertaining a pin capacitance 804 and means for ascertaining a time shift 806.

Means for extracting current source model 802 extracts the current source model of the gate. The current source model of the gate is a function of time and output voltage of the gate. The output voltage of the gate is determined from the d.c. transfer curve. Means for storing current source model 806 stores the current source model of the gate.

Means for ascertaining a pin capacitance 804 ascertains the pin capacitance as a load of the gate. The pin capacitance is ascertained before computing the output response for the gate. Means for ascertaining a time shift 806 ascertains the time shift as a time delay of the gate. The time shift is ascertained after computing the output response of the gate. The current source model is generated in accordance with the method steps described in conjunction with FIGS. 4A and 4B.

In various embodiments of the invention, the functional modules are implemented in the form of software. In various embodiments of the invention, the functional modules 802, 804, 806, and 808 can be a part of Electronic Design Automation (EDA) software for circuit design and verification.

FIG. 9 is a block diagram illustrating a general-purpose computer system for executing EDA software, in accordance with various embodiments of the present invention.

A computer system 900 contains a processor unit 902, a main memory 904, an interconnect bus 906, a mass storage device 908, a peripheral device(s) 910, an input control device(s) 912, a portable storage medium drive(s) 914, a graphics subsystem 916, and an output display 918. Processor unit 902 can include a single microprocessor or a plurality of microprocessors for configuring computer system 900 as a multiprocessor system. Main memory 904 stores, in part, instructions and data to be executed by processor unit 902. Main memory 904 can include banks of dynamic random access memory (DRAM) as well as high-speed cache memory.

For the purpose of simplicity, all the components of computer system 900 are connected via interconnect bus 906. However, computer system 900 may be connected through one or more data transport means. By way of example, processor unit 902 and main memory 904 may be connected via a local microprocessor bus; and mass storage device 908, peripheral device(s) 910, portable storage medium drive(s) 914, and graphics subsystem 916 may be connected via one or more input/output (I/O) buses. Mass storage device 908, which can be implemented with a magnetic disk drive or an optical disk drive, is a non-volatile storage device for storing data and instructions, to be used by processor unit 902. In the software embodiment, mass storage device 908 stores the software, to load it to main memory 904.

Portable storage medium drive 914 operates in conjunction with a portable non-volatile storage medium, such as a floppy disk or a compact disc read only memory (CD-ROM), to input and output data and code to and from computer system 900. In one embodiment, the software is stored on such a portable medium, and is input to computer system 900 via portable storage medium drive 914. Peripheral device(s) 910 can include any type of computer support device such as an input/output (I/O) interface, to add additional functionality to computer system 900. By way of example, peripheral device(s) 910 can include a network interface card, to interface computer system 900 to a network.

Input control device(s) 912 provide a portion of the user interface for a computer system 900 user. Input control device(s) 912 may include an alphanumeric keypad for inputting alphanumeric and other key information; a cursor control device such as a mouse, a trackball or stylus; or cursor direction keys. In order to display textual and graphical information, computer system 900 contains graphics subsystem 914 and output display 918. Output display 918 may include a cathode ray tube (CRT) display or liquid crystal display (LCD). Graphics subsystem 916 receives textual and graphical information, and processes the information for output-to-output display 918. The components of computer system 900 are those that are typically found in general-purpose computer systems, and, in fact, these components are intended to represent a broad category of such computer components that are well known in the art.

For software implementation, the EDA software includes a plurality of computer executable instructions, to be implemented on a general-purpose computer system. Prior to loading it into a general-purpose computer system, the EDA software may reside as encoded information on a computer-readable medium such as a magnetic floppy disk, a magnetic tape or a compact disc read only memory (CD-ROM). In one hardware implementation, the EDA software may comprise a dedicated processor comprising processor instructions for performing the functions described herein. Circuits may also be developed to perform these functions.

Various embodiments of the present invention relate to generating a current source model of a gate. As a result, various embodiments facilitate a method and system that provides timing and verification techniques, using a current source model of the gate generated using pre-characterized transition and delay information present in the timing library.

Various embodiments provide an accurate calculation of the response of the gate with an arbitrary load. This can be carried out by computing the signal delay of the gate for a load with large resistive shielding, which is coupled. Further, the system accurately calculates the response of the gate in the presence of switching aggressors.

Various embodiments determine a standard cell's output drive, as a current source. As a result, the system considers non-linearity due to switching of input vectors. Further, various embodiments provide accepting values of input slew through the fitting process. This is carried out by using the timing library, specified for current source models. As a result, additional expenditure is not incurred for formulating another timing library.

A system, as described in the present invention or any of its components, may be embodied in the form of a computer system. Typical examples of a computer system include a general-purpose computer, a programmed microprocessor, a micro-controller, a peripheral integrated circuit element, and other devices or arrangements of devices that are capable of implementing the acts of the present invention, including a computer readable medium having computer readable program code embodied therein, as is well understood in the art.

While the preferred embodiments of the present invention have been illustrated and described, it will be clear that the present invention is not limited to these embodiments only. Numerous modifications, changes, variations, substitutions and equivalents will be apparent to those skilled in the art, without departing from the spirit and scope of the present invention, as described in the claims.

What is claimed is:

1. A method for generating a current source model of a gate, the gate included with at least one driving point and at least one receiving point in a circuit, wherein a load is applied on the gate, the method comprising the steps of:

a. extracting a current source model of the gate, the current source model of the gate being a function of time and output voltage of the gate and based on data from a timing library, the current source model defining the output current when the output voltage deviation is within a threshold value by a linear relationship described by:

$$I_{out} = g(t) * (V_{out} - V_{dc})$$

where $I_{out}$ is the output current of the gate, $g(t)$ is an admittance of the load, $V_{out}$ is the output voltage of the gate, and $V_{dc}$ is the voltage in accordance with a d.c. transfer curve for the gate, and, the current source model defining the output current when the output voltage deviation exceeds the threshold value by a non-linear relationship described by:

$$I_{out}=g(t)*[e^{-\alpha(V_{out}-V_{dc})}-1]/\alpha$$

where $\alpha$ defines the gate's non-linearity established through a fitting process; and b. storing the current source model of the gate.

2. The method of claim 1, wherein extracting the current source model of the gate comprises:
   a. ascertaining a pin capacitance as the load for the gate, the pin capacitance being added to the load before computing an output response of the gate; and
   b. ascertaining a time shift for the gate as a time delay for the gate, the time shift being applied to the computed output response of the gate.

3. The method of claim 1, wherein the time is a function of an input slew of the gate.

4. The method of claim 1, wherein the output voltage of the gate is a function of input slew of the gate.

5. The method of claim 4, wherein the input slew is computed by accepting values from the timing library.

6. The method of claim 1, wherein extracting a current source model further comprises determining whether the load is zero, wherein if the load is zero, then the output voltage of the gate comprises the voltage according to the d.c. transfer curve for the gate.

7. The method of claim 6, wherein if the output voltage of the gate lies on the d.c transfer curve, then the current drawn by the gate is zero.

8. The method of claim 1, wherein the step of defining the output current when the output voltage deviation exceeds the threshold value includes the step of calculating $\alpha$ from the relationship:

$$[(D_1-D_2)/(\tau_1-\tau_2)]*\ln[(V_H/V_L)*((1-\alpha V_L)/(1-\alpha V_H))]-\ln[V*/1-\alpha V*]$$

where $D_1, D_2$ are respective delays corresponding to smallest input slew for the largest loads, $\tau_1, \tau_2$ are output slews corresponding to the largest loads, $V_H$ is a high slew measurement threshold, $V_L$ is a low slew measurement threshold and $V*$ is a reference voltage that defines delay at a particular time.

9. A system for generating a current source model of a gate, wherein a load is applied on the gate, the system comprising:
   a. means for extracting a current source model of the gate, the current source model of the gate being a function of time and output voltage of the gate and based on data from a timing library, said means for extracting a current source model of the gate including:
      (i) means for defining the output current when the output voltage deviation is within a threshold value by a linear relationship described by:

$$I_{out}=g(t)*(V_{out}-V_{dc})$$

where $I_{out}$ is the output current of the gate, g(t) is an admittance of the load, $V_{out}$ is the output voltage of the gate, and $V_{dc}$ is the voltage in accordance with a d.c. transfer curve for the gate, and,
      (ii) means for defining the output current when the output voltage deviation exceeds the threshold value by a non-linear relationship described by:

$$I_{out}=g(t)*[e^{-\alpha(V_{out}-V_{dc})}-1]/\alpha$$

where $\alpha$ defines the gate's non-linearity established through a fitting process; and b. means for storing the current source model of the gate.

10. The system of claim 9, wherein the means for extracting a current source model of the gate further comprises:
   a. means for ascertaining a pin capacitance as the load for the gate, the pin capacitance being added to the load before computing an output response of the gate; and
   b. means for ascertaining a time shift for the gate as a time delay for the gate, the time shift being applied to the computed output response of the gate.

11. The system of claim 9, wherein the means for extracting a current source model of a gate comprises determining whether the load is zero, wherein when the load is zero, the output voltage of the gate is according to the d.c. transfer curve for the gate and the current drawn by the gate is zero.

12. A computer program product for use with a computer, the computer program product comprising a computer usable medium having a computer readable program code embodied therein for generating a current source model of a gate by:
   a. extracting a current source model of the gate, the current source model of the gate being a function of time and output voltage of the gate and based on data from a timing library, the current source model defining the output current when the output voltage deviation is within a threshold value by a linear relationship described by:

$$I_{out}=g(t)*(V_{out}-V_{dc})$$

where $I_{out}$ is the output current of the gates g(t) is an admittance of the load, $V_{out}$ is the output voltage of the gate, and $V_{dc}$ is the voltage in accordance with a d.c. transfer curve for the gate, and, the current source model defining the output current when the output voltage deviation exceeds the threshold value by a non-linear relationship described by:

$$I_{out}=g(t)*[e^{-\alpha(V_{out}-V_{dc})}-1]/\alpha$$

where $\alpha$ defines the gate's non-linearity established through a fitting process; and b. storing the current source model of the gate.

13. The computer program product of claim 12, further comprising:
   a. ascertaining a pin capacitance as the load for the gate, the pin capacitance being added to the load before computing an output response of the gate; and
   b. ascertaining a time shift for the gate as a time delay for the gate, the time shift being applied to the computed output response of the gate.

14. The computer program product of claim 12, wherein extracting a current source model further comprises determining whether the load is zero, wherein when the load is zero, the output voltage of the gate is according to the d.c. transfer curve for the gate and the current drawn by the gate is zero.

* * * * *

UNITED STATES PATENT AND TRADEMARK OFFICE
CERTIFICATE OF CORRECTION

PATENT NO.        : 7,464,349 B1
APPLICATION NO.   : 11/246060
DATED             : December 9, 2008
INVENTOR(S)       : Igor Keller and Manuj Verma It is certified that error appears in the above-identified patent and that said Letters Patent is hereby corrected as shown below:

ON THE TITLE PAGE,

BLOCK [54]

PLEASE DELETE THE TITLE
"METHOD AND SYSTEM OR GENERATING A CURRENT SOURCE MODEL OF A GATE" AND INSERT THE CORRECT TITLE
-- METHOD AND SYSTEM FOR GENERATING A CURRENT SOURCE MODEL OF A GATE --

Signed and Sealed this

Seventeenth Day of March, 2009

JOHN DOLL
*Acting Director of the United States Patent and Trademark Office*

UNITED STATES PATENT AND TRADEMARK OFFICE
CERTIFICATE OF CORRECTION

PATENT NO. : 7,464,349 B1  
APPLICATION NO. : 11/246060  
DATED : December 9, 2008  
INVENTOR(S) : Igor Keller and Manuj Verma It is certified that error appears in the above-identified patent and that said Letters Patent is hereby corrected as shown below:

ON THE TITLE PAGE,

Item [54] and Column 1, lines 1 and 2,

PLEASE DELETE THE TITLE
"METHOD AND SYSTEM OR GENERATING A CURRENT SOURCE MODEL OF A GATE" AND INSERT THE CORRECT TITLE
-- METHOD AND SYSTEM FOR GENERATING A CURRENT SOURCE MODEL OF A GATE --

This certificate supersedes the Certificate of Correction issued March 17, 2009.

Signed and Sealed this

Seventh Day of April, 2009

JOHN DOLL  
*Acting Director of the United States Patent and Trademark Office*